(12) United States Patent
Kato et al.

(10) Patent No.: US 8,324,113 B2
(45) Date of Patent: Dec. 4, 2012

(54) SILICON PROCESSING METHOD AND SILICON SUBSTRATE WITH ETCHING MASK

(75) Inventors: Takahisa Kato, Tokyo (JP); Yasuhiro Shimada, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 558 days.

(21) Appl. No.: 12/545,235

(22) Filed: Aug. 21, 2009

(65) Prior Publication Data

US 2010/0051944 A1   Mar. 4, 2010

(30) Foreign Application Priority Data

Aug. 29, 2008 (JP) ................................. 2008-221247

(51) Int. Cl.
*H01L 21/302* (2006.01)
(52) U.S. Cl. .............. 438/753; 216/41; 216/83; 216/96; 216/99; 438/689; 438/745
(58) Field of Classification Search .......................... None
See application file for complete search history.

(56) References Cited

U.S. PATENT DOCUMENTS

| 4,317,611 | A | 3/1982 | Petersen |
| 5,888,852 | A | 3/1999 | Yuki et al. |
| 6,015,978 | A | 1/2000 | Yuki et al. |
| 6,579,740 | B2 | 6/2003 | Toyoda |

FOREIGN PATENT DOCUMENTS

| JP | 06-232112 | * | 8/1994 |
| JP | 6-232112 | A | 8/1994 |
| JP | 9-293703 | A | 11/1997 |
| JP | 2004-037607 | A | 2/2004 |
| JP | 2008-041676 | A | 2/2008 |

OTHER PUBLICATIONS

Translation of Office Action in Japanese Application No. 2008-221247 (Jun. 5, 2012).

\* cited by examiner

*Primary Examiner* — Lan Vinh
*Assistant Examiner* — Jiong-Ping Lu
(74) *Attorney, Agent, or Firm* — Fitzpatrick, Cella, Harper & Scinto

(57) ABSTRACT

A silicon processing method includes: forming a mask pattern on a principal plane of a single-crystal silicon substrate; and applying crystal anisotropic etching to the principal surface to form a structure including a (111) surface and a crystal surface equivalent thereto and having width W1 and length L1. The principal plane includes a (100) surface and a crystal surface equivalent thereto or a (110) surface and a crystal surface equivalent thereto. A determining section for determining the width W1 of the structure is formed in the mask pattern. The width of the determining section for the width W1 of the mask pattern is width W2. The width of the mask pattern other than the determining section is larger than the width W2 over a length direction of the mask pattern.

5 Claims, 14 Drawing Sheets

RELATED ART

SILICON PROCESSING METHOD AND SILICON SUBSTRATE WITH ETCHING MASK

BACKGROUND OF THE INVENTION

1. Field of the Invention

The present invention relates to a method of manufacturing a micro machine member and the like from a silicon wafer according to a semiconductor process, and, more particularly to a silicon processing method for manufacturing a silicon structure from a wafer, a silicon substrate with etching mask, and the like. The structure is used as, for example, an elastic member and configures a micro oscillator that performs oscillation. The oscillator can be used for optical apparatuses such as a light deflector and an image forming apparatus using the light deflector, sensors such as an acceleration sensor and an angular velocity sensor, and the like.

2. Description of the Related Art

Conventionally, micro machine members manufactured from a wafer according to a semiconductor process can be processed in a micrometer order. Various micro functional elements are realized by using the micro machine members (see, Japanese Patent Application Laid-Open No. H06-232112). As one of such methods of finely processing silicon, there is a method of performing anisotropic etching with an alkali solution after forming an etching mask on a wafer. The anisotropic etching is a method of forming, making use of the fact that an etching rate of a (111) surface of silicon and a crystal surface equivalent thereto (these are collectively referred to as (111) equivalent surface as well) is lower than other crystal surfaces, a structure mainly including the (111) surface and the crystal surface equivalent thereto. This is a simple processing method of immersing wafers in the alkali solution. A large number of wafers can be collectively processed. Therefore, inexpensive micro-order processing is possible. More specifically, the anisotropic etching is etching performed by using etchant having a characteristic that the etching does not proceed in a specific crystal orientation. A microstructure with a specific crystal surface set as a reference, i.e., a structure specified by the crystal surface can be created at extremely high processing accuracy. Examples of anisotropic etchant include KOH (potassium hydroxide), TMAH (tetramethyl ammonium hydroxide solution), EDP (ethylene diamine pyrocatechol+water), NaOH (sodium hydroxide) and hydrazine.

In a silicon micro functional element, a structure subjected to stress is often used. With the anisotropic etching, a member having a smooth processed surface can be obtained. In particular, when the structure subjected to stress is formed, since the smooth surface can avoid stress concentration, a structure having satisfactory durability can be manufactured.

A light deflector that performs optical scanning by torsionally oscillating a reflection surface with a micro oscillator formed by such a technique (see U.S. Pat. No. 4,317,611) has, for example, the following characteristics compared with an optical scanning optical system that uses a rotary multisurface mirror such as a polygon mirror: the light deflector can be reduced in size and power consumption is small. In particular, power consumption can be further reduced by driving the light deflector near a resonant frequency of the torsional oscillation of the micro oscillator.

However, as one of problems of the method of manufacturing a structure from a wafer according to the anisotropic etching, an error occurs in a processing dimension between a formed etching mask and a crystal axis direction of the wafer because of an alignment error. For example, when such a structure is used as a spring to manufacture a micro oscillator, a spring constant error occurs because of the processing dimension error. This is likely to lead to a manufacturing error of a resonant frequency of the micro oscillator.

SUMMARY OF THE INVENTION

In view of the problems, a silicon processing method according to the present invention has characteristics described below. The silicon processing method is a silicon processing method including forming a mask pattern on a principal plane of a single-crystal silicon substrate and applying crystal anisotropic etching to the principal surface to form a structure including a (111) surface and a crystal surface equivalent thereto and having width W1 and length L1. The principal plane is formed by one of a (100) surface and a crystal surface equivalent thereto (these are collectively referred to as (100) equivalent surface as well) and a (110) surface and a crystal surface equivalent thereto (these are collectively referred to as (110) equivalent surface as well). A determining section for determining the width W1 of the structure is formed in the mask pattern. The width of the determining section for the width W1 of the mask pattern is width W2. The width of the mask pattern other than the determining section is larger than the width W2 over a length direction of the mask pattern.

The determining section having the width W2 can be caused to be present near the center of the length L1. The mask pattern can have a recess, and the determining section having the width W2 can be formed by the recess.

The width of the mask pattern can be increased over the length L1 direction in proportion to a distance from the determining section having the width W2.

In the silicon processing method, when an angle formed by the width W2 direction and the width W1 direction is represented as an angle θ, the width W2 can have a relation $W1 = W2 \cdot \cos \theta$.

In the silicon processing method, when a distance from the determining section having the width W2 of the mask pattern is represented as x, a distribution of widths of the mask pattern over the length direction of the mask pattern is represented as W(x), and a maximum tolerance of the angle formed by the width W2 direction and the width W1 direction is represented as θ*, a relation $W(x) \geq W2 + 2 \cdot |x| \cdot \tan \theta^*$ can be satisfied.

In view of the problems, a silicon substrate with etching mask according to the present invention has characteristics described below. A mask pattern corresponding to a target shape of a structure including a (111) surface and a crystal surface equivalent thereto and having width W1 and length L1 is formed on a single-crystal silicon substrate. The single-crystal silicon substrate has one of a (100) surface and a crystal surface equivalent thereto and a (110) surface and a crystal surface equivalent thereto as a principal plane. The mask pattern has a determining section for determining the width W1 of the structure. The width of the determining section for the width W1 of the mask pattern is the width W2. The width of the mask pattern other than the determining section is larger than the width W2 over a length direction of the mask pattern.

In view of the problems, a method of manufacturing a micro oscillator according to the present invention has characteristics described below. The method is a method of manufacturing a micro oscillator including a supporting substrate, a torsion spring, and a movable section supported by the torsion spring to be capable of torsionally oscillating around a torsion axis with respect to the supporting substrate. The micro oscillator has at least one resonant frequency around the torsion axis. The structure is formed to be the torsion spring by the silicon processing method.

In view of the problems, an optical apparatus such as an image forming apparatus according to the present invention includes a light deflector having a micro oscillator manufactured by the method of manufacturing a micro oscillator and a light deflecting element provided in the movable section. The light deflector reflects and deflects a light beam from a light source and makes at least a part of the light beam incident on a light irradiation target such as a photosensitive member.

According to the present invention, the width of the mask pattern other than the determining section is set larger than the width of the determining section of the mask pattern for determining the width W1 of the structure. Therefore, even if there is an alignment error between a crystal axis direction and the etching mask, it is possible to realize silicon processing that can form a structure with less processing dimension error. Therefore, for example, if the structure formed by the silicon processing method according to the present invention is used as a spring of the micro oscillator, it is possible to reduce a spring constant error due to manufacturing.

Further features of the present invention will become apparent from the following description of exemplary embodiments with reference to the attached drawings.

DESCRIPTION OF THE EMBODIMENTS

Figure 1A:
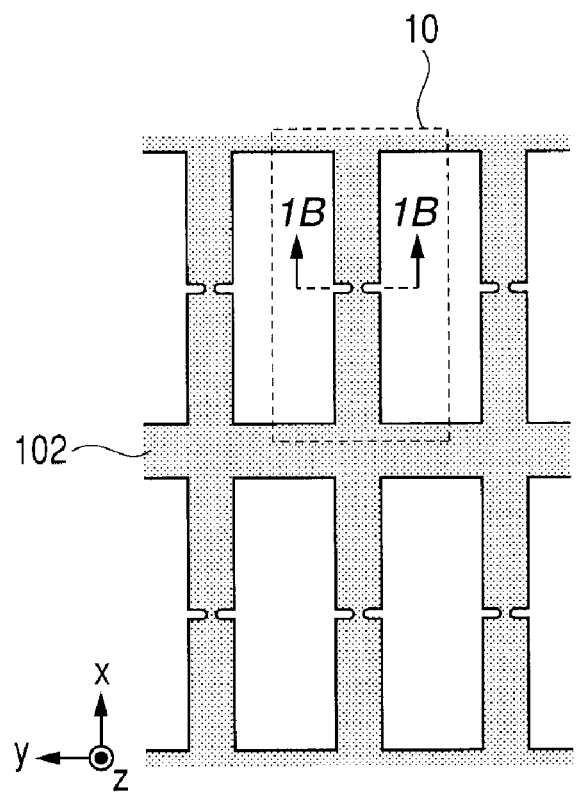
FIG. 1A is a top view illustrating an etching mask pattern according to a first embodiment of the present invention.

Embodiments of the present invention are described below. What is important in a silicon processing method, a silicon substrate with etching mask, and the like according to the present invention is as described below. In order to make use of a characteristic of crystal anisotropic etching, a determining section for determining width W1 of a structure is formed in an etching mask pattern to prevent the width of the etching mask pattern other than the determining section from being set smaller than the width of the determining section (to set the width of the etching mask pattern other than the determining section larger than the width of the determining section). Based on this idea, basic embodiments of the silicon processing method, the silicon substrate with etching mask, and the like according to the present invention have configurations described below.

In a basic embodiment of the silicon processing method, a mask pattern is formed on a single-crystal silicon substrate, a principal plane of which is a (100) surface and a crystal surface equivalent thereto or a (110) surface and a crystal surface equivalent thereto. Crystal anisotropic etching is applied to the single-crystal silicon substrate to form a structure including a (111) surface and a crystal surface equivalent thereto or the like and having width W1 and length L1. The mask pattern has a determining section having the width W2 for determining the width W1 of the structure. The width of the mask pattern other than the determining section is larger than the width W2 over a length direction of the mask pattern.

In the embodiment, forms described below can be adopted. First, the determining section having the width W2 can be caused to present near the center of the length L1. The mask pattern can have a recess. The determining section having the width W2 can be formed by the recess. These forms are described in a first embodiment later.

The width of the mask pattern can be increased over the length L1 direction in proportion to a distance from the determining section having the width W2. This form is adopted in an example illustrated in FIG. 8B and a second embodiment. When an angle formed by the width W2 direction and the width W1 direction (i.e., an alignment error) is represented as an angle θ, the width W2 can be set to have a relation W1=W2·cos θ. When a distance from the determining section of the mask pattern is represented as x, a distribution of widths of the mask pattern over the length direction of the mask pattern is represented as W(x), and a maximum tolerance of the angle formed by the width W2 direction and the width W1 direction is represented as θ*, a relation W(x)≧W2+2·|x|·tan θ* is satisfied. These forms are also described in detail in the first embodiment later.

In a basic embodiment of the silicon substrate with etching mask, a mask pattern corresponding to a target shape of a structure including a (111) surface and a crystal surface equivalent thereto or the like and having width W1 and length L1 is formed on a single-crystal silicon substrate. The single-crystal silicon substrate has a (100) surface and a crystal surface equivalent thereto or a (110) surface and a crystal surface equivalent thereto as a principal plane. The mask pattern has a determining section having width W2 for determining the width W1 of the structure. The width of the mask pattern other than the determining section is larger than the width W2 over a length direction of the mask pattern. The specific forms described above can be adopted.

According to the silicon processing method, the structure can be formed to be a torsion spring as described in detail in first and second embodiments later. It is possible to configure a micro oscillator including, together with the torsion spring, a supporting substrate and a movable section supported by the torsion spring to be capable of torsionally oscillating around a torsion axis with respect to the supporting substrate. The micro oscillator has at least one resonant frequency around the torsion axis. The structure is formed to be the torsion spring by the silicon processing method.

It is also possible to configure an optical apparatus such as an image forming apparatus described in detail in a third embodiment later including a light deflector consisting of a micro oscillator manufactured by the method of manufacturing a micro oscillator a movable section of which oscillator is applied to the reflecting mirror. The light deflector reflects and deflects a light beam from a light source and makes at least a part of the light beam incident on a light irradiation target such as a photosensitive member.

In the embodiments, since the width of the mask pattern other than the determining section is not smaller than the width of the determining section of the mask pattern for determining the width W1 of the structure, even if there in an alignment error between a crystal axis direction and an etching mask, a structure with less processing dimension error can be formed.

Embodiments of the present invention are described below with reference to the accompanying drawings.

First Embodiment

A silicon processing method and a configuration example of a structure processed by the silicon processing method are described as a first embodiment of the present invention.

First, the silicon processing method according to this embodiment is described with reference to FIGS. 1A and 1B to FIG. 5. FIG. 5 is a top view of a silicon wafer 100 used for the silicon processing method according to this embodiment. The silicon wafer 100 is a single crystal of silicon. A normal direction on a paper surface of FIG. 5 is a <100> crystal axis direction. The silicon wafer 100 has an orientation flat 105 indicating a <110> crystal axis direction. An etching mask pattern 101 is formed on the surface of the silicon wafer 100. Plural structures can be formed by one wafer. Even if the etching mask pattern 101 has an alignment error with respect to the <110> crystal axis direction, a processing dimension error of a structure to be formed can be reduced by the silicon processing method according to this embodiment.

FIGS. 1A and 1B to FIGS. 3A and 3B are enlarged diagrams of a part of the etching mask pattern 101 or a structure illustrated in FIG. 5. A relation between an etching mask and a processed structure is described with reference to these figures.

Figure 1B:
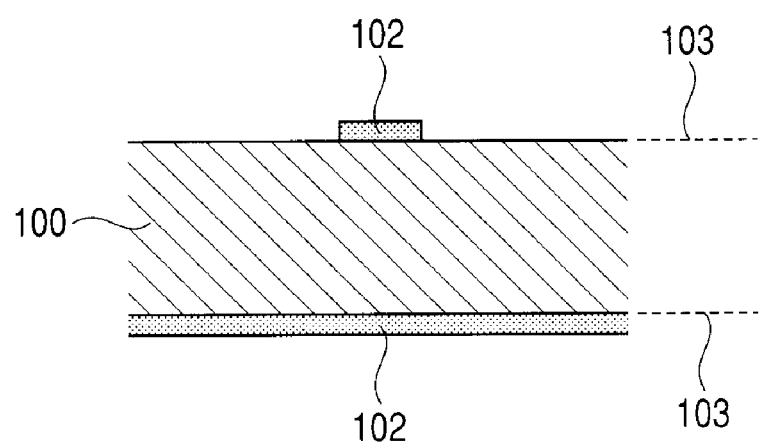
FIG. 1B is a sectional view taken along a line 1B-1B of FIG. 1A.

FIG. 1A is an enlarged top view of a part of the etching mask pattern 101. FIG. 1B is a sectional view taken along a line 1B-1B of FIG. 1A. After silicon nitride films are formed on both sides of the silicon wafer 100, the etching mask pattern 101 of silicon nitride is formed by photolithography. As illustrated in FIG. 1A, the etching mask pattern 101 according to this embodiment has a pattern of a silicon nitride film 102 illustrated in the figure in which a plurality of formation units 10 of a structure indicated by a broken line is arrayed. With a longitudinal direction of the silicon nitride film 102 represented by the formation unit 10 of a structure set as an x direction, a coordinate of the etching mask pattern 101 is set in a direction illustrated in FIG. 1A. The etching mask pattern 101 is formed with the x direction aligned in the <110> crystal axis direction indicated by the orientation flat 105 illustrated in FIG. 5. As illustrated in FIG. 1B, a surface on which a pattern is formed in FIG. 1A is a (100) surface of the silicon wafer 100 and a crystal surface 103 equivalent thereto. On the other hand, a silicon nitride film 102 is uniformly formed on the rear surface.

Figure 2A:
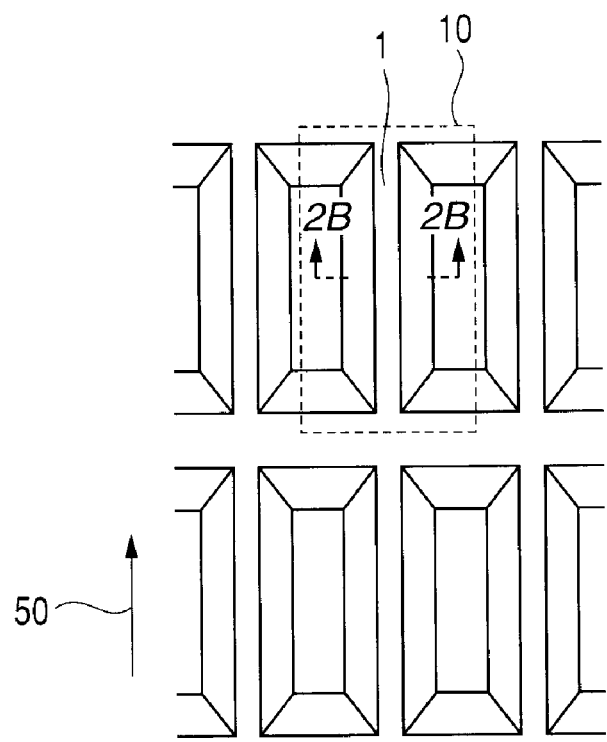
FIG. 2A is a top view illustrating a structure according to the first embodiment.
Figure 2B:
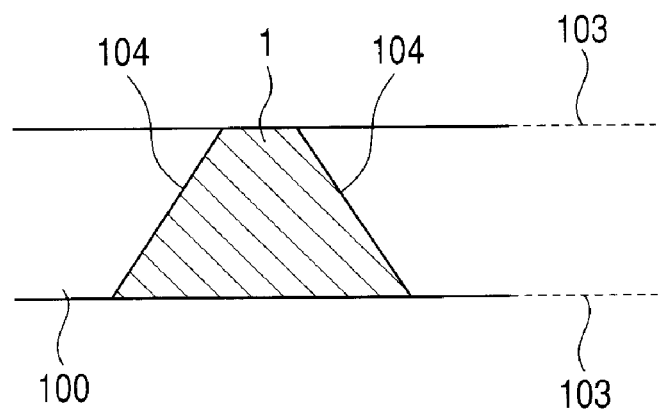
FIG. 2B is a sectional view taken along a line 2B-2B of FIG. 2A.

FIGS. 2A and 2B illustrate a state in which, after steps of FIGS. 1A and 1B, anisotropic etching is applied to the silicon wafer 100 with an alkali solution to remove the silicon nitride films on both sides of the silicon wafer 100. As the alkali solution, potassium hydroxide solution and the like can be used. FIG. 2A is a top view of a section same as that illustrated in FIG. 1A. FIG. 2B is a sectional view taken along a line 2B-2B of FIG. 2A. As illustrated in FIG. 2A, a single-crystal silicon structure 1 fixed at both ends is formed in the section of the formation unit 10 of the structure. According to the anisotropic etching by the alkali solution, as illustrated in FIG. 2B, the structure 1 has a trapezoidal section surrounded by a (111) surface and a crystal surface 104 equivalent thereto and the (100) surface and the crystal surface 103 equivalent thereto. In FIG. 2A, an arrow 50 indicates the <110> crystal axis direction.

Figure 3A:
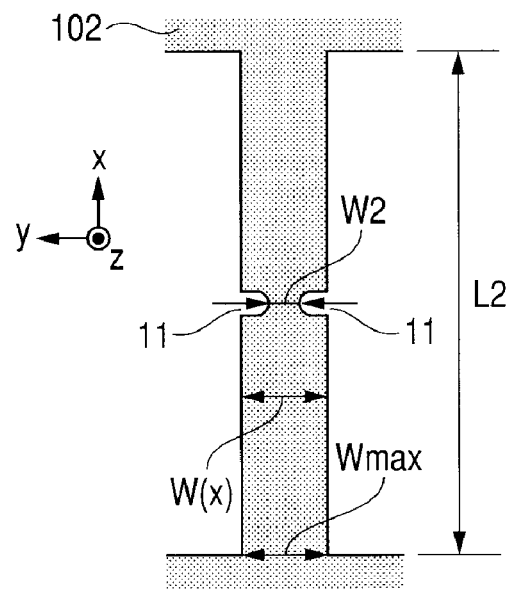
FIG. 3A is a top view illustrating an etching mask pattern as a formation unit of a structure according to the first embodiment.

A correspondence relation between dimensions of the etching mask pattern 101 and the structure 1 described with reference to FIGS. 1A and 2A is described with reference to FIGS. 3A and 3B. Enlarged diagrams of the formation unit 10 of a structure illustrated in FIGS. 1A and 2A are respectively illustrated as FIGS. 3A and 3B. As illustrated in FIG. 3A, the etching mask pattern 101 has length L2 corresponding to the length L1 of the structure. In a coordinate of the etching mask pattern 101, an x direction of the coordinate is set in the length L2 direction. The etching mask pattern 101 has width W(x) in a coordinate y direction. In the present invention, the width W(x) is distributed over the coordinate x direction. In other words, the width W(x) is not fixed (for example, continuously changes as illustrated in FIG. 8B) and the etching mask pattern 101 has the minimum width W2 in a range of the length L2. In this embodiment, in particular, as illustrated in FIG. 3A, a recess 11 is formed in a section in the center of L2 to form the minimum width W2. On the other hand, the width W(x) of a section where the recess 11 is not formed is uniformly Wmax.

Figure 3B:
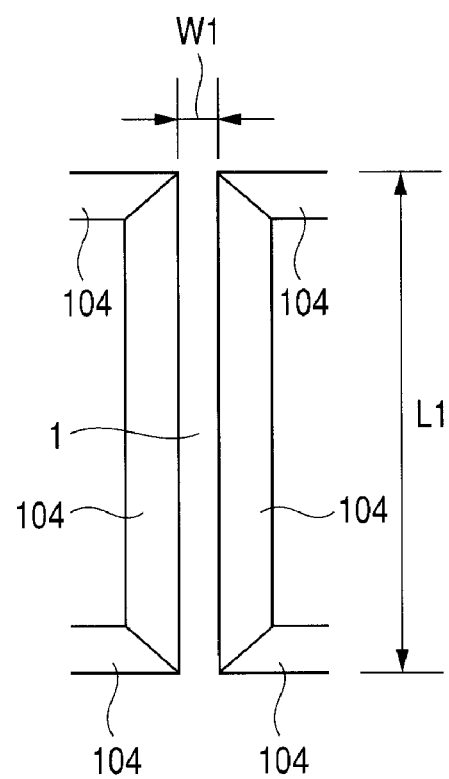
FIG. 3B is a top view illustrating the structure according to the first embodiment.

According to the etching mask pattern 101 illustrated in FIG. 3A, the structure 1 is formed as illustrated in FIG. 3B. The formed structure 1 has the length L1 as illustrated in the figure. The structure 1 has the width W1 in a direction perpendicular to the length L1. As illustrated in FIG. 2B, W1 is determined by the (111) surface and the crystal surface 104 equivalent thereto and is substantially a fixed value over the length L1.

FIG. 3B illustrates a state in which the coordinate x direction in FIG. 3A is ideally aligned with the <110> crystal axis direction indicated by the orientation flat 105 of the silicon wafer 100. The width W1 and the width W2 have the following relation:

$$W2 = W1 + 2 \times \text{etching amount of the (111) surface and the crystal surface 104 equivalent thereto} \quad \text{(Expression 1)}$$

A second term of the right side of Expression 1 is an amount generally taken into account as an etching mask for performing anisotropic etching and is evident as a relation between a structure to be formed and the etching mask. Therefore, in the following description, this term is omitted. For example, Expression 1 is represented as follows:

$$W2 = W1 \quad \text{(Expression 2)}$$

Concerning all other dimensions, unless specifically noted otherwise, an etching amount of the (111) surface and the crystal surface 104 equivalent thereto is taken into account for an etching mask for forming dimensions determined by the (111) surface and the crystal surface 104 equivalent thereto and this term is omitted in the described relation.

In the state in which the coordinate x direction is ideally aligned with the <110> crystal axis direction, the width W2 of the etching mask pattern 101 is a section for determining W1 of the structure 1 to be formed. This is because silicon is etched on a surface other than the (111) surface and the crystal surface equivalent thereto by anisotropic etching until the width of silicon is reduced to the width W2. At the width W2, the (111) surface and the crystal surface equivalent thereto appear as illustrated in FIG. 3B.

In this way, even if the width W(x) of the etching mask pattern 101 has a distribution in the length L2 direction, the width W1 of the structure 1 to be formed has a fixed value in the length L1 direction. Consequently, the width W1 is determined by the width W2, which is the minimum of W(x).

A processing error of the width W1 due to an alignment error between the <110> crystal axis direction and the coordinate x direction of the etching mask pattern 101 is described with reference to FIGS. 4A and 4B, FIGS. 6A and 6B and FIG. 7. Major factors of such an alignment error include an error between the orientation flat 105 and the <110> crystal axis direction and an error between the orientation flat 105 and the etching mask pattern 101. These errors typically appear as an angular error of about ±0.1°. However, in the figures, the angular error is emphasized to facilitate understanding.

Figure 4A:
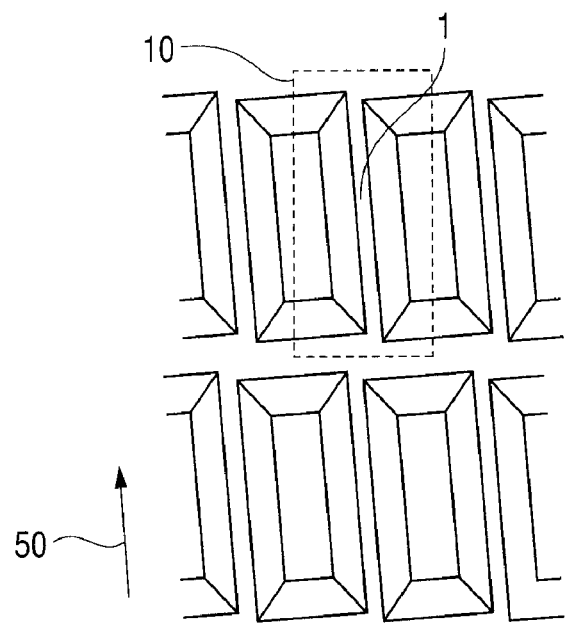
FIG. 4A is a top view illustrating the structure formed when an alignment error occurs in the first embodiment.
Figure 4B:
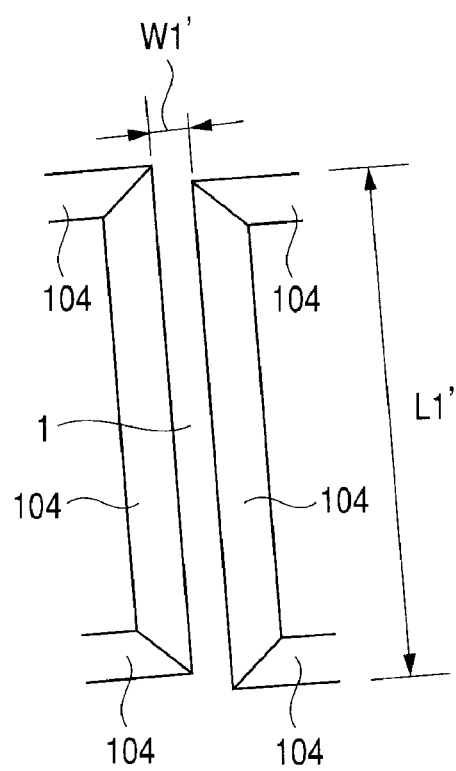
FIG. 4B is an enlarged top view illustrating the structure formed when the alignment error occurs.
Figure 5:
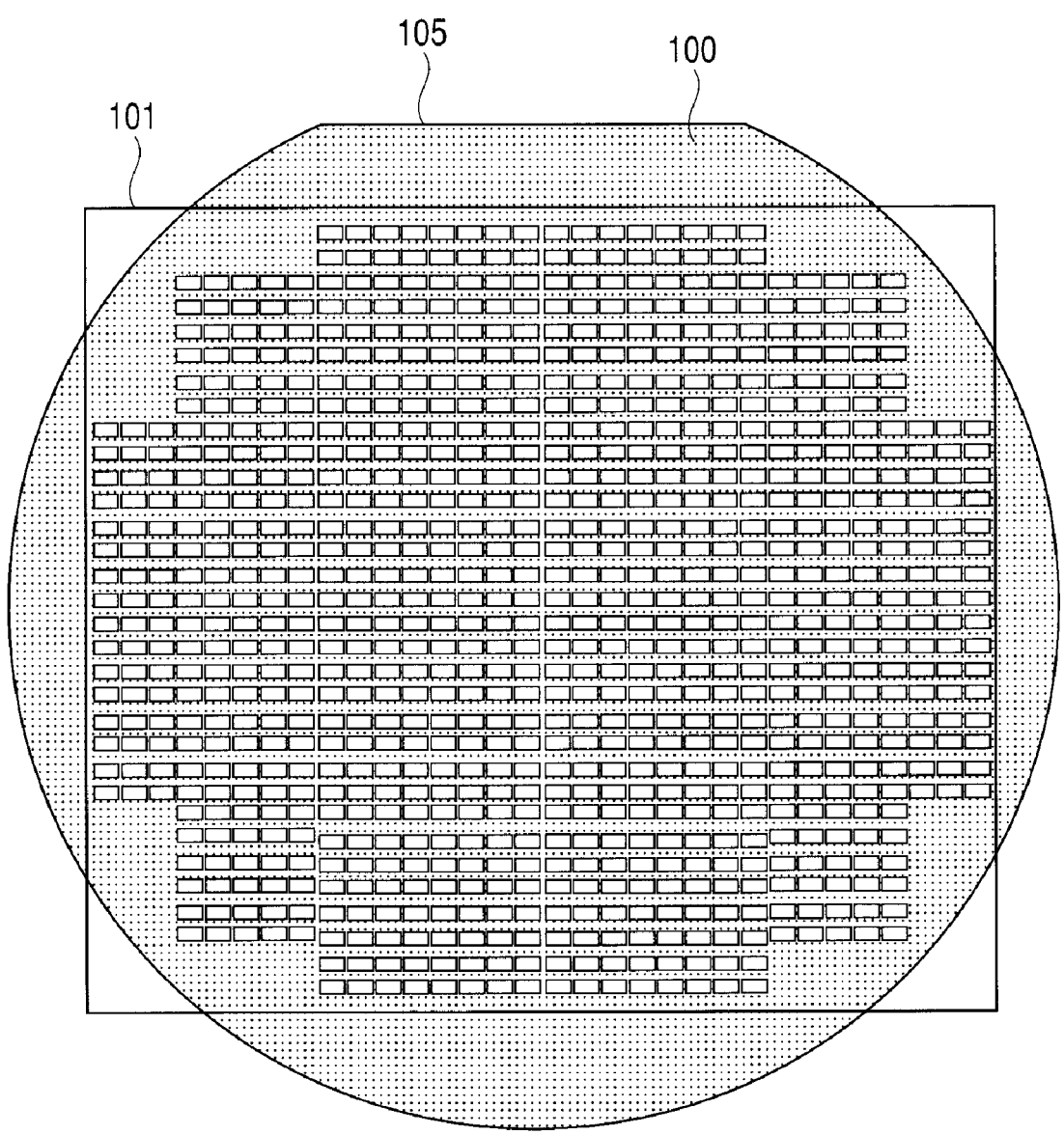
FIG. 5 is a schematic top view illustrating a silicon wafer according to the present invention.

FIG. 4A is a top view of a section equivalent to the section illustrated in FIG. 2A at the time when an alignment error occurs between the coordinate x direction illustrated in FIG. 1A and the <110> crystal axis direction 50. As indicated by the structure 1 in FIG. 4A, compared with FIG. 2A, the structure 1 is formed to be tilted by the alignment error. FIG. 4B is a further enlarged diagram of the formation unit 10 of a structure illustrated in FIG. 4A. As illustrated in FIG. 4B, the structure 1 surrounded by the (111) surface and the crystal surface 104 equivalent thereto has width W1' and length L1'. A direction of the length L1' is a direction along the structure 1 determined by the (111) surface and the crystal surface 104 equivalent thereto, i.e., along the <110> crystal axis direction. A direction of the width W1' is a direction perpendicular to the length L1'. As it is understood from the figures, even when the alignment error occurs, the width of the structure 1 is determined by the (111) surface and the crystal surface 104 equivalent thereto and has a substantially fixed value W1' over the length L1' direction.

Figure 6A:
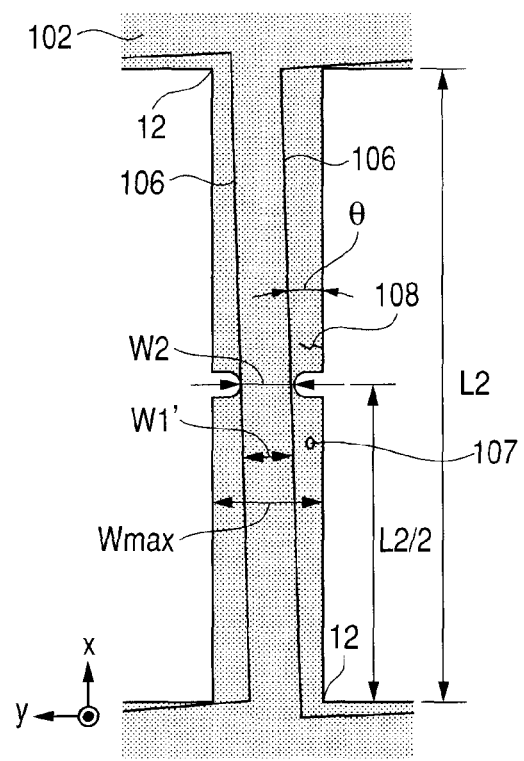
FIG. 6A is a top view illustrating details of the etching mask pattern according to the first embodiment.
Figure 6B:
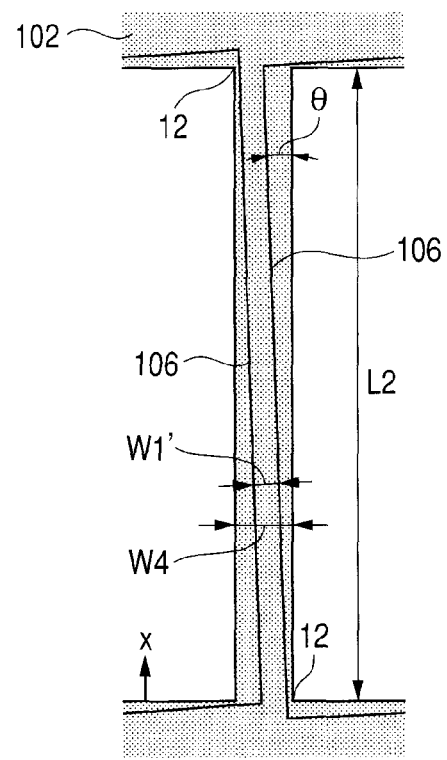
FIG. 6B is a top view illustrating an etching mask pattern in a related art.

A principle of reduction of a processing dimension error by the silicon processing method according to the present invention is described with reference to FIGS. 6A and 6B and FIG. 7. FIGS. 6A and 6B are top views of the etching mask pattern 101 as the formation unit 10 of a structure. FIG. 6A illustrates an etching mask pattern according to this embodiment illustrated in FIG. 1A. On the other hand, FIG. 6B illustrates an etching mask pattern according to a related art. The etching mask pattern according to the related art has a shape illustrated in the figure having length L2 and width W4. Like a coordinate of the etching mask pattern 101 according to this embodiment, when a coordinate with the length L2 direction set as the x direction is set, the width W4 is fixed in the length L2 direction. The width W4 and the length L2 are designed as follows such that the structure 1 illustrated in FIG. 3B is formed in an ideal state without an alignment error:

$$L2 = L1 \quad \text{(Expression 3)}$$

$$W4 = W1 \quad \text{(Expression 4)}$$

FIGS. 6A and 6B illustrate, as explanation of occurrence of an alignment error, a processed surface 106 as a contour line of the structure 1 after anisotropic etching. The processed surface 106 is a line formed when the (111) surface and the crystal surface equivalent thereto, which remain after etching by an etching mask and the surface of a wafer, cross each other. In FIGS. 6A and 6B, an angle θ formed by the <110> crystal axis direction and the coordinate x direction is illustrated as an amount of the alignment error (θ=0 is an ideal state).

In a silicon processing method according to the related art illustrated in FIG. 6B, when an alignment error occurs, the width W1' of the structure 1 to be formed is determined by a space in the <110> crystal axis direction between two corners 12. This is because the (111) surface and the crystal surface equivalent thereto first appear in the places of the two corners 12 and, thereafter, etching on both sides of the silicon nitride film 102 having the width W4 and the length L2 stops respectively in a place where the (111) surface and the crystal surface equivalent thereto appears. The place is connected to the (111) surface and the crystal surface equivalent thereto. Therefore, compared with the width W4 of the structure 1 in the ideal state without an alignment error, the width W1' is small. A reduction amount of this width is larger as the length L1 of the structure 1 desired to be formed is larger. W1' and W4 can be approximated in the following relation in an range of an assumed alignment error:

$$W1' = W4 - L2 \cdot \tan\theta \quad \text{(Expression 5)}$$

When a processing error ϵ of width is set as (W1'−W4)/W4, in the related art, the processing error ϵ is represented by the following expression:

$$\epsilon = (L2/W4) \cdot \tan\theta \quad \text{(Expression 6)}$$

In the related art, as indicated by Expression 6, in the case of a shape with a large value of L2/W4, the processing error ϵ due to an alignment error is large. Therefore, in general, when a structure with a large value of L2/W4, for example, a beam, a spring, or an arrayed partition wall is formed by anisotropic etching, the processing error ϵ is a main cause of a processing error in width.

On the other hand, in an etching mask pattern according to this embodiment illustrated in FIG. 6A, as described above, there is a distribution of the width W(x) along the coordinate x direction (i.e., the width W(x) is not fixed). As illustrated in the figure, the etching mask pattern has the width W2 in the center of the length L2. The width W2 is set to a value equal to the width W4 of the structure 1 desired to be formed. In this embodiment, as described above, the width of the section other than the recess 11 is Wmax. Wmax is determined by an assumed alignment error θ. In the case of this embodiment, if an alignment error range in which a processing error is desired to be reduced is ±θ*, Wmax is set according to a relation of the following expression:

$$Wmax \geq W2 + 2 \cdot (L2/2) \cdot \tan \theta^* \quad \text{(Expression 7)}$$

In the etching mask pattern according to this embodiment, even if there is an alignment error, the two corners 12 does not determine the width W1 of the structure to be formed. The width W2 determines the width W1. This is because the (111) surface and the crystal surface equivalent thereto first appear in places of both sides of the determining section for the width W2 and, thereafter, etching on both sides of other sections of the silicon nitride film 102 having the length L2 stops respectively in a place where the (111) surface and the crystal surface equivalent thereto appears. The place is connected to the (111) surface and the crystal surface equivalent thereto. Therefore, the width W1' of a structure formed at this point and the processing error ε of the structure are represented by the following expressions:

$$W1' = W2 \cdot \cos \theta \quad \text{(Expression 8)}$$

$$\epsilon = \cos \theta - 1 \quad \text{(Expression 9)}$$

Therefore, in the etching mask pattern according to this embodiment, the processing error ε with respect to the alignment error θ can be reduced to an extremely small value. As it is seen from Expression 9, the processing error ε does not depend on the length L2 of the structure. Therefore, even a structure shape, in which a processing error is large according to the related art, can be formed at high accuracy.

Further, as illustrated in FIG. 6A, in the etching mask pattern according to the present invention including this embodiment, even if there is a crack 108, a pinhole 107, or the like near an edge of the pattern, this does not affect a processing error in width. In the mask pattern of the related art illustrated in FIG. 6B, such a defect of the mask near the edge directly leads to a processing error in width.

Figure 7:
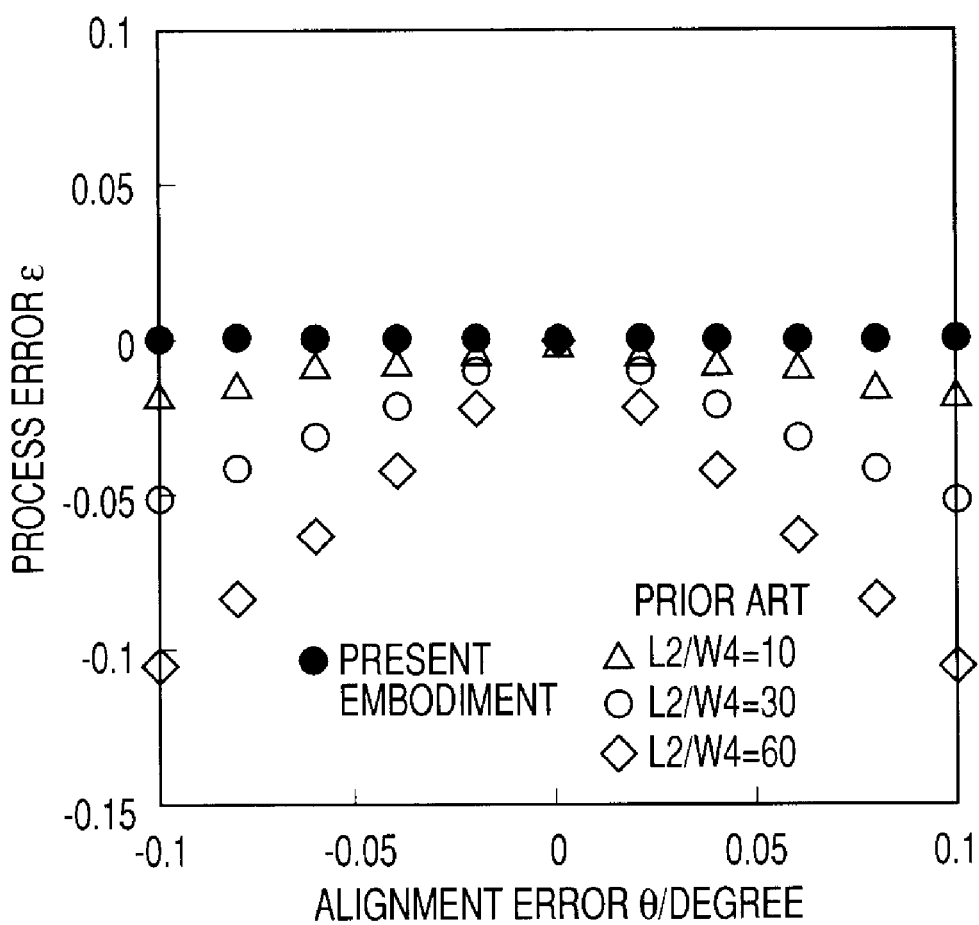
FIG. 7 is a graph for comparing processing errors due to an alignment error in the present invention and the related art.

A graph of FIG. 7 indicates relations between the alignment error θ and the processing error ε caused when the etching mask patterns according to the related art and this embodiment are used. As described above, in a range of the alignment error θ±0.1° that is likely to typically occur, whereas the processing error ε of this embodiment is about −6 ppm, in the related art, when L2/W4=60, the processing error ε is about −10%. In this way, in this embodiment, for a structure having any value of L2/W4, it is possible to reduce a processing error in width of the structure due to an alignment error.

As described above, according to the silicon processing method by the etching mask according to this embodiment, even if there is an alignment error between an actual crystal axis direction and the etching mask, a processing error of a structure due to anisotropic etching can be reduced. Since a smooth plane is obtained by silicon processing by the anisotropic etching, even a structure having small width and large length used as an elastic member can be formed in a form with high processing accuracy and less easily broken.

Even if there are slight defects (a tear, a hole, etc.) in a contour of the etching mask, a processing error in width of the structure caused by that portion can also be reduced. In particular, as in the etching mask according to this embodiment, if a section having the width W2 is formed by using a recess and an area of other sections having large width is increased, a probability of occurrence of a processing error in width of the structure due to these defects can be further reduced.

As in the etching mask according to this embodiment, if the section having the width W2 is formed by using the recess, a main shape of an etching mask pattern can be formed by a combination of rectangles. Therefore, when an etching mask pattern is formed by photolithography, the structure of a photomask can be simplified. Therefore, the etching mask pattern can be inexpensively formed.

It goes without saying that the etching mask according to the present invention can reduce a processing error even when the section having the width W2 is not located in the center of the length L2 unlike this embodiment.

Figure 8A:
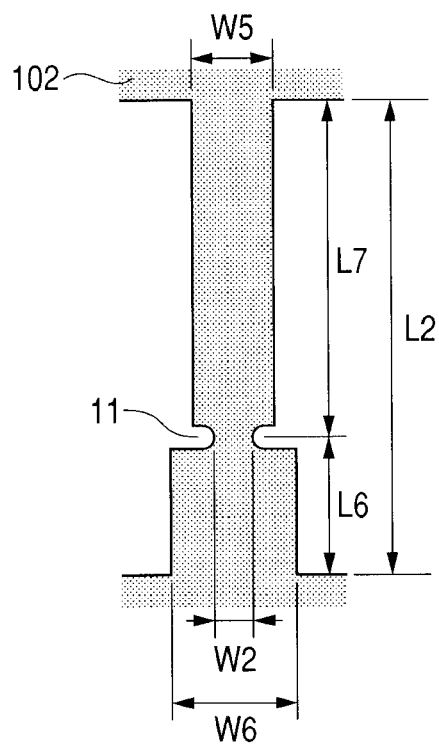
FIG. 8A is a top view illustrating an etching mask pattern according to a modification of the first embodiment.
Figure 8B:
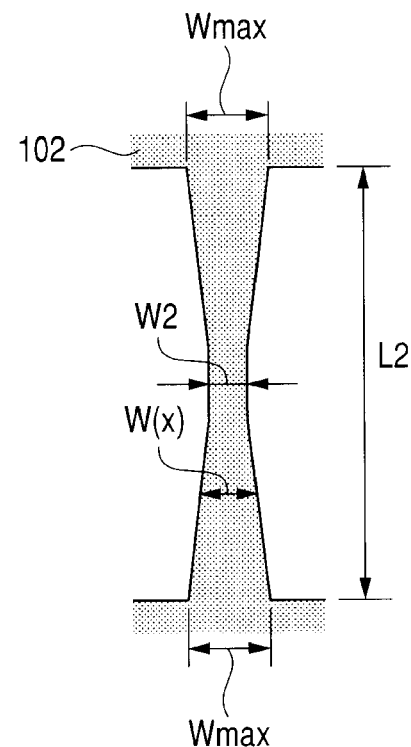
FIG. 8B is a top view illustrating an etching mask pattern according to another modification of the first embodiment.

FIG. 8A illustrates a modification of the etching mask in which the section having the width W2 illustrated in FIG. 6A is not located in the center of the length L2. In this case, if an alignment error range in which a processing error is desired to be reduced is ±θ*, values of widths W5 and W6 other than the width W2 have the following relation:

$$W5 \geq W2 + 2 \cdot (L6) \cdot \tan \theta^* \quad \text{(Expression 10)}$$

$$W6 \geq W2 + 2 \cdot (L7) \cdot \tan \theta^* \quad \text{(Expression 11)}$$

In the modification illustrated in FIG. 8A, as in this embodiment, a processing error can be reduced as indicated by the graph of FIG. 7.

However, like the etching mask according to this embodiment, by locating the section having the width W2 in the center of the length L2, a maximum of the width W(x) of the etching mask can be reduced to a smallest value. Therefore, a difference between the maximum width of the etching mask and the width of a final shape formed by anisotropic etching can be reduced. Consequently, it is possible to reduce an etching amount until the (111) surface and the crystal surface equivalent thereto are exposed during etching and form a smooth etching surface. If the difference between the maximum width of the etching mask and the width of the final shape increases, an etching speed error is likely to be caused by update of liquid during etching, accumulation of generated air bubbles, and the like. However, it is possible to reduce the etching speed error. Further, the etching mask in a section where silicon is etched tends to be broken before removal. However, since an area of such a section can be reduced, a processing method with high reliability can be obtained.

Further, by adopting a configuration illustrated in FIG. 8B, it is possible to further reduce the difference between the maximum width of the etching mask and the width of the final shape formed by anisotropic etching. FIG. 8B illustrates another modification of the etching mask as the formation unit 10 of a structure. Components having functions same as those illustrated in FIG. 6A are denoted by the same reference numerals and signs. In the configuration illustrated in FIG. 8B, the section having the width W2 is located in the center of the length L2 as in FIG. 6A. On the other hand, unlike FIG. 6A, the width W(x) monotonously increases to the section having the width Wmax over the length L2. By forming the etching mask in this way, it is possible to reduce the difference between the maximum width of the etching mask and the width of the final shape of the structure formed by anisotropic etching.

Furthermore, in the configuration illustrated in FIG. 8B, it is also possible to set the section having the width W2 of the etching mask at one end of the length L2 and monotonously increase the width W(x) toward the section having the width Wmax. However, in such a form, the difference between the maximum width of the etching mask and the width of the final shape of the structure formed by anisotropic etching is relatively large.

Second Embodiment

Figure 11A:
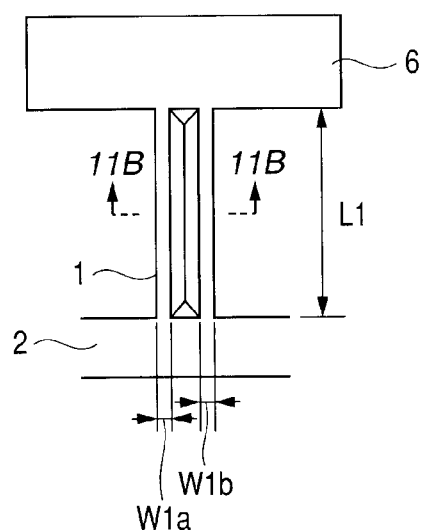
FIG. 11A is a top view illustrating a micro oscillator manufactured by silicon processing in the second embodiment.
Figure 11B:
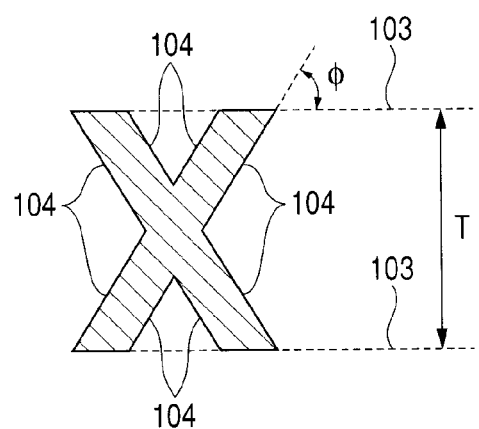
FIG. 11B is a sectional view taken along a line 11B-11B of FIG. 11A.
Figure 11C:
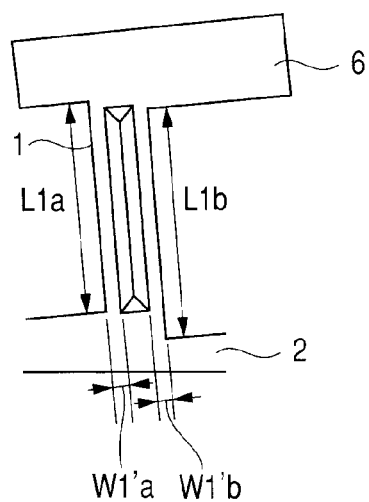
FIG. 11C is a top view illustrating the micro oscillator manufactured when an alignment error occurs in the second embodiment.
Figure 12A:
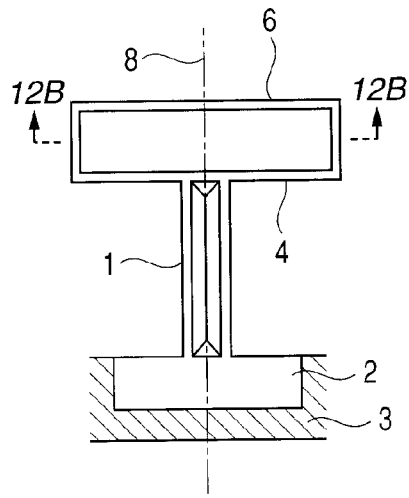
FIG. 12A is a top view of a light deflector manufactured by silicon processing in the second embodiment.
Figure 12B:
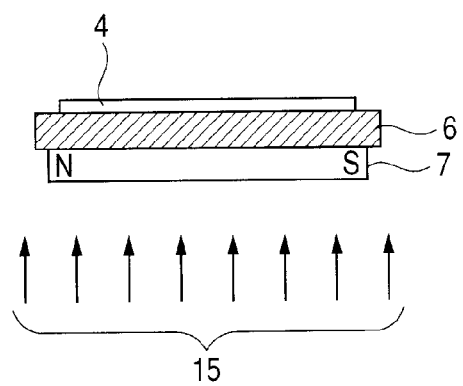
FIG. 12B is a sectional view illustrating a movable section of the light deflector manufactured by silicon processing in the second embodiment.
Figure 12C:
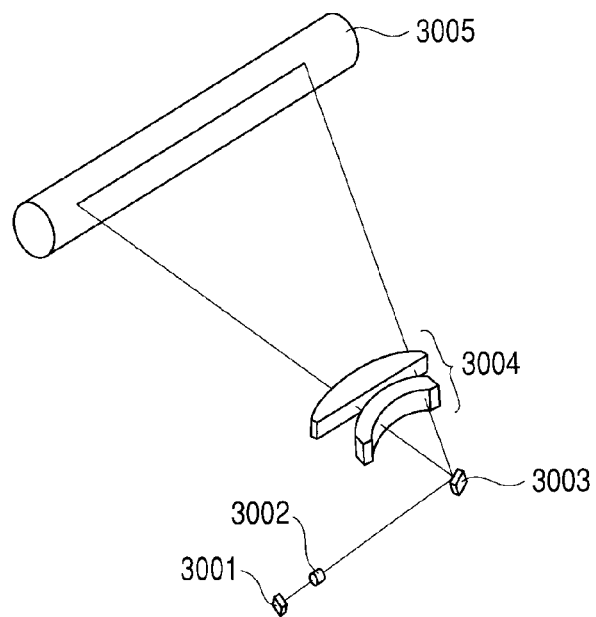
FIG. 12C is a schematic perspective view illustrating an optical apparatus including a light deflector manufactured by silicon processing according to a third embodiment of the present invention.

A second embodiment of the present invention is described. In FIGS. 11A to 11C, a configuration example of a micro oscillator manufactured by the silicon processing method according to this embodiment is illustrated. FIG. 11A is a top view of the micro oscillator and FIG. 11B is a sectional view taken along line 11B-11B of FIG. 11A. FIGS. 12A to 12C are diagrams illustrating a light deflector including the micro oscillator according to this embodiment. FIG. 12A is a top view of the light deflector and FIG. 12B is a sectional view taken along a line 12B-12B of FIG. 12A. In these figures, components having functions same as those in the first embodiment are denoted by the same reference numerals and signs.

In the micro oscillator illustrated in FIGS. 11A to 11C and the light deflector illustrated in FIGS. 12A to 12C, reference numeral 2 denotes a supporting section, 3 denotes a fixing section, 4 denotes a reflection surface, 6 denotes a movable section, 7 denotes a permanent magnet forming a driving unit, and 8 denotes a torsion axis. As illustrated in FIGS. 12A to 12C, when the reflection surface 4 is formed in the movable section 6 and the permanent magnet 7 is set on a rear surface of a surface on which the reflection surface 4 is formed, the micro oscillator illustrated in FIGS. 11A to 11C is formed as a light deflector that scans light. In particular, when the micro oscillator is fixed to the fixing section 3, which is mechanically grounded, via the supporting section 2, the micro oscillator is a torsion oscillator including the structure 1 having the torsion axis 8 set as a torsion center. As illustrated in FIG. 12B, torque is generated by applying an AC magnetic flux 15 from a magnetic field generating unit (also forming the driving unit) not illustrated in the figure such as a coil and causing the AC magnetic flux 15 to act on the permanent magnet 7. The micro oscillator can be oscillated around the torsion axis 8 near a resonant frequency.

The light deflector according to this embodiment has, with respect to the torsion axis 8, a resonant frequency f in a relation of the following expression:

$$f = 1/(2 \cdot \pi) \cdot \sqrt{(2K/I)} \quad \text{(Expression 12)}$$

where, K represents a torsion spring constant around the torsion axis 8 of the structure 1 and I represents moment of inertia around the torsion axis 8 of the movable section 6.

As illustrated in FIG. 11B, the structure 1 of the micro oscillator according to this embodiment is formed by anisotropic etching of silicon by an alkali solution as in the first embodiment. Therefore, surfaces forming the structure 1 are, as illustrated in the figure, the (100) surface and the crystal surface equivalent thereto or the (111) surface and the crystal surface equivalent thereto. As illustrated in the figure, in the structure 1 according to this embodiment, two thin square sections are combined to form an X-shaped polygon.

When dimensions $W1a$ (=$W1b$) and L1, wafer thickness T, and an angle $\Phi$ (=54.7°) formed by the (100) surface and the crystal surface 103 equivalent thereto and the (111) surface and the crystal surface 104 equivalent thereto are used, the torsion spring constant K of the structure 1 having the sections can be approximated by the following expression:

$$K = G \cdot \{(\sin \Phi)^2 \cdot T \cdot (W1a)^3\}/(3 \cdot L1) \quad \text{(Expression 13)}$$

In this embodiment, $W1a = W1b = 85$ μm, L1=2800 μm and T=300 μm. In the form illustrated in FIGS. 12A to 12C, f is about 2.7 kHz.

As indicated by Expression 13, since the torsion spring constant K is proportional to a cube of the width $W1a$ of the structure 1, a dimension error of $W1a$ has a larger influence on a torsion spring constant error than the length L and the wafer thickness T. In addition, length $L2$/width $W1a$=33. The width of the structure 1 of such a shape has a large processing error due to an alignment error in the silicon processing method of the related art. On the other hand, with the silicon processing method according to the present invention, a processing error of the width $W1a$ of the structure 1 can be reduced. Further, when the structure 1 is used as a spring as in this embodiment, a spring constant error can be effectively reduced.

Figure 9:
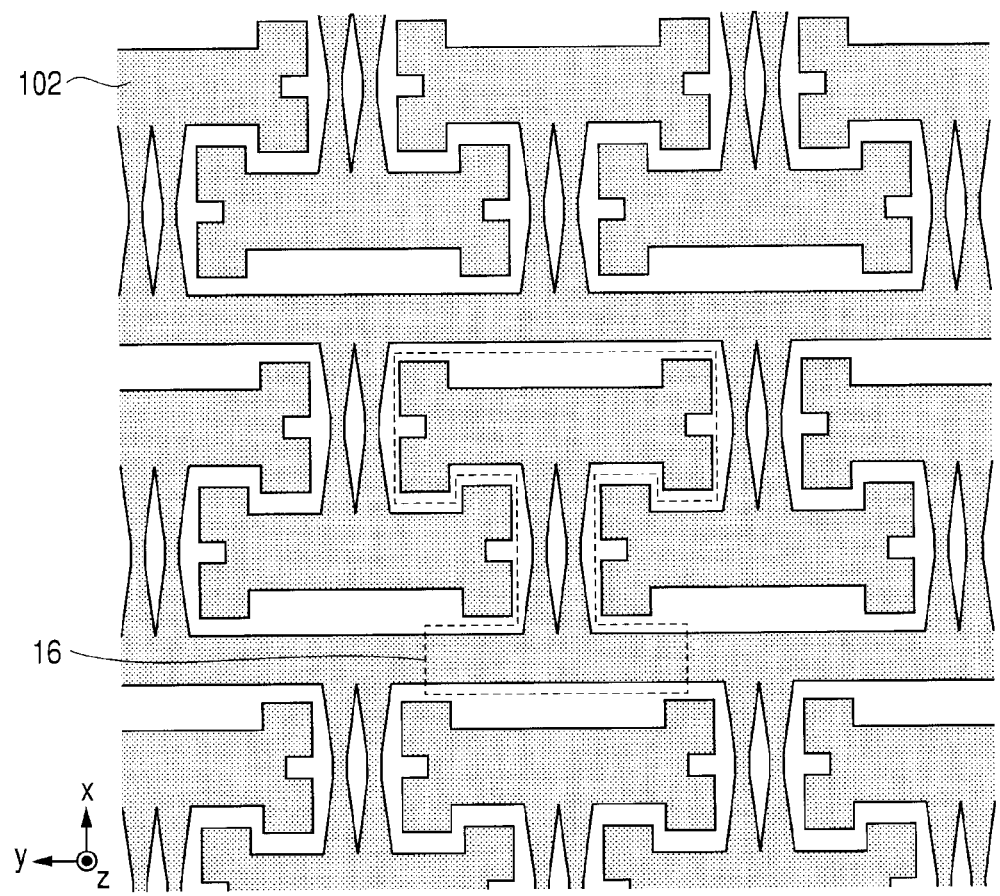
FIG. 9 is a top view illustrating an etching mask pattern according to a second embodiment of the present invention.

An etching mask pattern of the silicon processing method according to this embodiment is described with reference to FIG. 9 and FIGS. 10A to 10C. Components having functions same as those in the first embodiment are denoted by the same reference numerals and signs. FIG. 9 is an enlarged top view of the etching mask pattern 101 formed on the silicon wafer 100 illustrated in FIG. 5. As in the first embodiment, the etching mask pattern 101 is formed with the coordinate x direction in FIG. 9 aligned with the <110> crystal axis direction indicated by the orientation flat 105 illustrated in FIG. 5.

A broken line section illustrated in FIG. 9 indicates a formation unit 16 of a micro oscillator. As illustrated in the figure, in the silicon processing method according to this embodiment, plural micro oscillators can be formed adjacent to one another. A structure formation planned section and an oscillator formation planned section of the silicon nitride film 102 are arranged close to each other in adjacent elements.

Figure 10A:
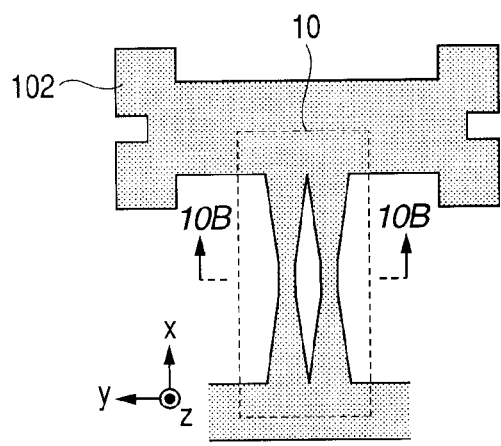
FIG. 10A is a top view illustrating an etching mask pattern as a formation unit of a micro oscillator according to the second embodiment.
Figure 10B:
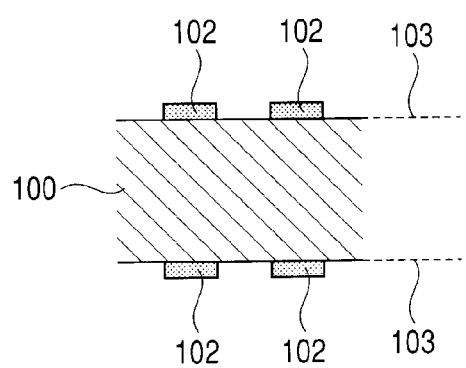
FIG. 10B is a sectional view taken along a line 10B-10B of FIG. 10A.
Figure 10C:
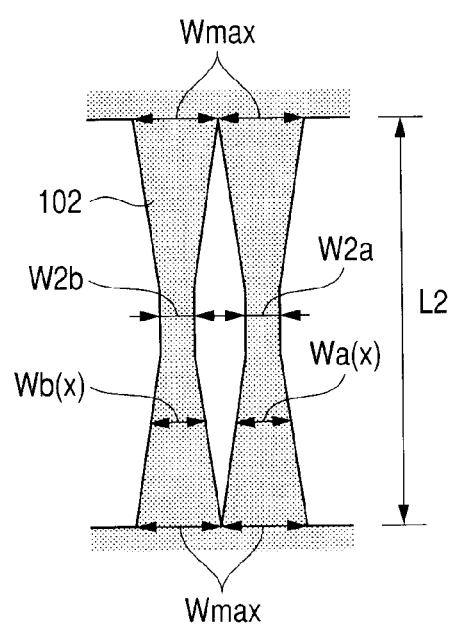
FIG. 10C is a top view illustrating an etching mask pattern as a formation unit of a structure according to the second embodiment.

An enlarged top view of the formation unit 16 of a micro oscillator is illustrated in FIG. 10A. A sectional view along a line 10B-10B of FIG. 10A is illustrated in FIG. 10B. An enlarged top view of the formation unit 10 of a structure is illustrated in FIG. 10C. Unlike the first embodiment, the formation unit 10 of a structure according to this embodiment has a characteristic pattern in order to form the structure 1 having the X-shaped section illustrated in FIGS. 11A to 11C. As illustrated in FIGS. 10A to 10C, the formation unit 10 generally has a shape formed by arranging a pair of the patterns illustrated in FIG. 8B. As illustrated in FIG. 10B, the pattern illustrated in FIG. 10A is also formed on a rear surface. Therefore, anisotropic etching by an alkali solution is also performed from both the front and rear surfaces of the wafer.

On the other hand, as in the first embodiment, when the coordinate x direction is set in the length L2 direction, the widths Wa(x) and Wb(x) of the etching mask pattern have distributions in the x direction. The etching mask pattern has widths $W2a$ and $W2b$ in the center of the length L2. Further away from the center, the widths Wa(x) and Wb(x) monotonously increase to reach a maximum Wmax. In particular, $W2a$ and $W2b$ and $W1a$ and $W1b$ illustrated in FIG. 11A have the following relation:

$$W2a = W2b = W1a = W1b \quad \text{(Expression 14)}$$

Wmax is set to have the following relation with respect to the assumed alignment error range ±θ* under the same principle as Equation 7 described above:

$$W\max \geq W2a + 2 \cdot (L2/2) \cdot \tan \theta^* \quad \text{(Expression 15)}$$

With the etching mask pattern described above, the micro oscillator illustrated in FIGS. 11A to 11C is formed.

The micro oscillator formed when the alignment error θ occurs is described. In this case, the micro oscillator has a shape illustrated in the top view of FIG. 11C. A principle of occurrence of a processing error due to the alignment error θ is the same as that in the first embodiment. Since the micro oscillator according to this embodiment has the X shape in section as illustrated in FIG. 11B, the width and the length of the structure 1 appear as lengths $L1a$ and $L2b$ and widths $W1a'$ and $W1b'$ illustrated in FIG. 11C. As the length of the structure 1, an average of L1a and L2b only has to be set as representative length. Concerning the width of the structure 1, the widths W1a' and W1b' are equal and have the following relation with the width W2a (=W2b):

$$W1a' = W2a \cdot \cos\theta \quad \text{(Expression 16)}$$

$$\epsilon = \cos\theta - 1 \quad \text{(Expression 17)}$$

The processing error ∈ of width is set as (W1a'−W2a)/W2a.

In this way, in the structure 1 having the X-shaped section as in this embodiment, it is possible to reduce the processing error ∈ of width with respect to the alignment error θ in a relation same as that described in the first embodiment. In this embodiment, a relation between wafer thickness and with width and the space of the two etching mask patterns arranged in parallel is appropriately set to realize the structure 1 having the X-shaped section.

As described above, concerning the micro oscillator that performs torsional oscillation around the torsion axis as in this embodiment, since an error of a term of a cube of the width W1a in Expression 13 is reduced, an error of a spring constant can be effectively reduced. Therefore, further, an error of the resonant frequency f of Expression 12 can also be reduced. When the light deflector illustrated in FIGS. 12A to 12C is formed, since an error of the resonance frequency f is reduced, a light deflector that can be driven at a desired frequency and saved power can be stably manufactured.

Figure 13A:
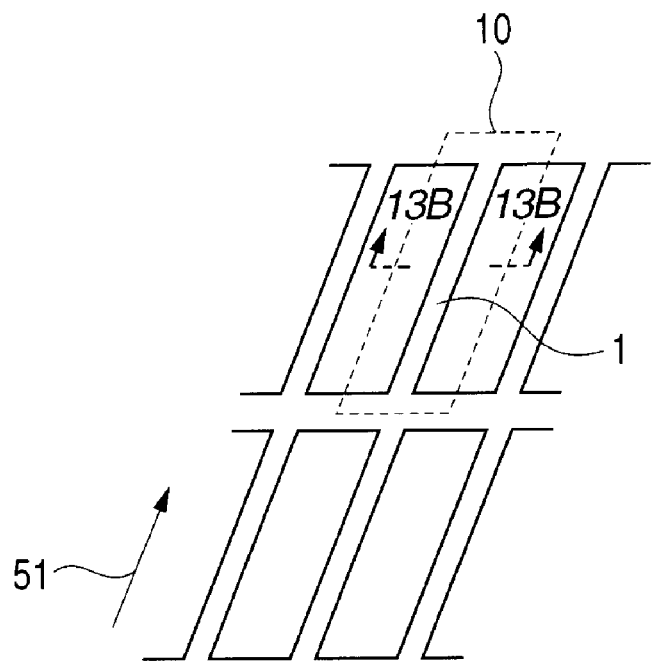
FIG. 13A is a top view illustrating a structure according to a modification of the first embodiment.
Figure 13B:
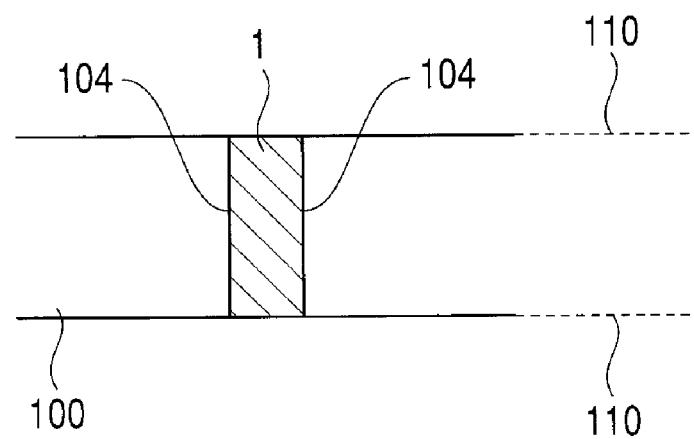
FIG. 13B is a sectional view taken along a line 13B-13B of FIG. 13A.
Figure 14A:
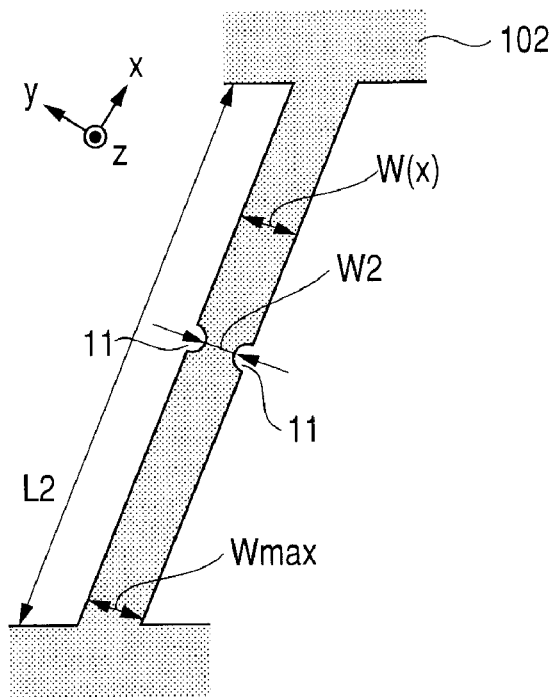
FIG. 14A is a top view illustrating an etching mask pattern as a formation unit of a structure according to the modification of the first embodiment.
Figure 14B:
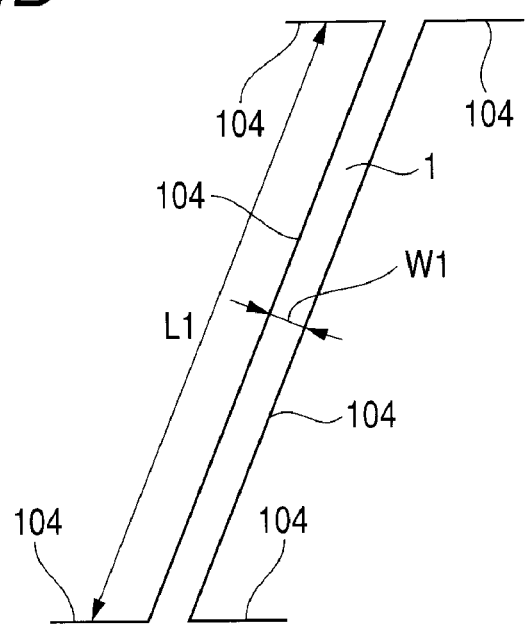
FIG. 14B is a top view illustrating the structure according to the modification of the first embodiment.

In the first and second embodiments, the single-crystal silicon substrate, the principal plane of which is the (100) surface and the crystal surface equivalent thereto, is described. However, the same processing can be performed by a single-crystal silicon substrate, a principal plane of which is the (110) surface and the crystal surface equivalent thereto. Specifically, a mask pattern is formed on the principal plane of the single-crystal silicon substrate, the principal plane of which is the (110) surface and the crystal surface equivalent thereto, and subjected to crystal anisotropic etching. Consequently, as illustrated in FIGS. 13A and 13B corresponding to FIGS. 2A and 2B, it is possible to form the structure 1 having width and length including the (110) surface and the crystal surface 110 equivalent thereto and the (111) surface and the crystal surface 104 equivalent thereto perpendicular to the (110) surface and the crystal surface 110 equivalent thereto. In FIG. 13A, an arrow 51 indicates a <111> crystal axis direction. In this case, as illustrated in FIGS. 14A and 14B corresponding to FIGS. 3A and 3B, in the mask pattern, the width of a determining section for the width W1 of the structure is the width W2. The width of the mask pattern other than the determining section is larger than the width W2 over the length direction of the mask pattern. However, the (111) surface and the crystal surface equivalent thereto are perpendicular to the (110) surface and the crystal surface equivalent thereto. Therefore, a section of the structure 1 of a form corresponding to the first embodiment is formed in a rectangular shape. A section of the structure 1 of a form corresponding to the second embodiment is formed in a shape in which two thin square sections are arranged in parallel.

Third Embodiment

A third embodiment of the present invention is described. FIG. 12C is a schematic perspective view illustrating an optical apparatus according to the third embodiment in which the light deflector illustrated in FIGS. 12A to 12C in the second embodiment is used.

An image forming apparatus is illustrated as the optical apparatus. In FIG. 12C, reference numeral 3003 denotes the light deflector according to the second embodiment, which one-dimensionally scans incident light. Reference numeral 3001 denotes a laser beam source as a light source. Reference numeral 3002 denotes a lens or a lens group, 3004 denotes a writing lens or a writing lens group, and 3005 denotes a drum-like photosensitive member as a light irradiation target.

A laser beam emitted from the laser beam source 3001 is subjected to predetermined intensity modulation related to timing for light deflection scanning. This intensity modulated light is one-dimensionally scanned by the optical scanning system (the light deflector) 3003 through the lens or the lens group 3002. The scanned laser beam forms an image on the photosensitive member 3005 through the writing lens or the writing lens group 3004.

The photosensitive member 3005 rotated around a rotation axis in a direction perpendicular to a scanning direction is uniformly charged by a charger not illustrated in the figure. When light is scanned over the photosensitive member 3005, an electrostatic latent image is formed on a scanned section of the photosensitive member 3005. Subsequently, a toner image is formed in an image section of the electrostatic latent image by a developing device not illustrated in the figure. An image is formed on a sheet by, for example, transferring the toner image onto a sheet not illustrated in the figure and fixing the toner image.

In this embodiment, a stable image can be formed at lower power consumption by the light deflector 3003 according to the second embodiment with less error of a resonant frequency.

It goes without saying that the light deflector can be used in other optical apparatuses. In these apparatuses, the light deflector reflects and deflects a light beam from a light source and makes at least a part of the light beam incident on a light irradiation target. Examples of such optical apparatuses include, besides image forming apparatuses such as a laser beam printer, an image display apparatus and an apparatus that scans a light beam such as a barcode reader. The silicon processing method according to the present invention can be applied to manufacturing of micro structures of, besides the optical apparatuses, for example, an acceleration sensor and an angular velocity sensor manufactured by using the micro machine technique.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-221247, filed Aug. 29, 2008, which is hereby incorporated by reference herein in its entirety.

What is claimed is:

1. A silicon processing method comprising:
   forming a mask pattern on a principal plane of a single-crystal silicon substrate, the principal plane including one of a (100) surface and a crystal surface equivalent thereto and a (110) surface and a crystal surface equivalent thereto; and
   applying crystal anisotropic etching to the principal surface to form a structure including a (111) surface and a crystal surface equivalent thereto and including etched portions having a length L1 and an unetched portion between the etched portions having a distance W1,
   wherein determining sections for determining the distance W1 and the length L1 of the structure are formed in the mask pattern, and
   wherein when a distance of the determining sections for determining the distance W1 is a distance W2, a length of the mask pattern for determining the length L1 is a length L2, a maximum length of the mask pattern in a direction of the length L2 from one of the determining sections is Xmax, a width of the mask pattern in the direction of the distance W2 in a portion of the Xmax is Wmax, and a maximum tolerance of an angle of alignment error between L1 and L2 is θ*, Wmax is set to satisfy an expression:

$W\mathrm{max} = W2 + 2 \cdot X\mathrm{max} \cdot \tan\theta^*$.

2. The silicon processing method according to claim 1, wherein the determining sections having the distance W2 are caused to be present near a center of the length L1.

3. The silicon processing method according to claim 2, wherein
the mask pattern has recesses, and
the determining sections having the distance W2 are formed by the recesses.

4. The silicon processing method according to claim 3, wherein a width of the mask pattern of a section where a recess is not formed is Wmax.

5. The silicon processing method according to claim 1, wherein the width of the mask pattern in a direction of the distance W2 is increased over the length L1 direction in proportion to a distance from the determining section having the width W2.

* * * * *